United States Patent
Nogawa

(10) Patent No.: US 10,091,377 B2
(45) Date of Patent: Oct. 2, 2018

(54) IMAGE FORMING APPARATUS, CONTROL METHOD FOR FLASH MEMORY, AND NON-TRANSITORY COMPUTER-READABLE STORAGE MEDIUM

(71) Applicant: Konica Minolta, Inc., Chiyoda-ku, Tokyo (JP)

(72) Inventor: Hiroshi Nogawa, Hachioji (JP)

(73) Assignee: Konica Minolta, Inc., Chiyoda-ku, Tokyo (JP)

( * ) Notice: Subject to any disclaimer, the term of this patent is extended or adjusted under 35 U.S.C. 154(b) by 54 days.

(21) Appl. No.: 14/726,179

(22) Filed: May 29, 2015

(65) Prior Publication Data

US 2015/0350479 A1   Dec. 3, 2015

(30) Foreign Application Priority Data

Jun. 3, 2014 (JP) .................................. 2014-114588

(51) Int. Cl.
 G06K 15/02 (2006.01)
 H04N 1/00 (2006.01)
 (Continued)

(52) U.S. Cl.
 CPC ..... *H04N 1/00912* (2013.01); *G11C 11/5628* (2013.01); *G11C 16/10* (2013.01);
 (Continued)

(58) Field of Classification Search
 CPC .................................................. H04N 1/00912
 See application file for complete search history.

(56) References Cited

U.S. PATENT DOCUMENTS

2003/0120772 A1* 6/2003 Husain ................ G06F 11/2033
 709/224
2006/0171210 A1* 8/2006 Nagashima ......... G11C 11/5628
 365/189.16
(Continued)

FOREIGN PATENT DOCUMENTS

| JP | 2008-9919 A | 1/2008 |
|---|---|---|
| JP | 2009-048680 A | 3/2009 |
| JP | 2009-064394 A | 3/2009 |

OTHER PUBLICATIONS

Office Action (Notification of Reasons for Refusal) dated Sep. 20, 2016 issued by the Japanese Patent Office in corresponding Japanese Patent Application No. 2014-114588, and English language translation of Office Action (10 pages).

*Primary Examiner* — King Poon
*Assistant Examiner* — Michael Burleson
(74) *Attorney, Agent, or Firm* — Buchanan Ingersoll & Rooney PC

(57) ABSTRACT

Provided is an image forming apparatus, a control method, and a non-transitory computer-readable storage medium storing a control program. An image forming apparatus includes a flash memory, where a recording area of the flash memory can be regionally switched between a multilevel recording mode and a binary recording mode. The image forming apparatus further includes a history information creating section which creates use history information; a determining section which determines high frequently used data piece or pieces among data pieces stored in the flash memory, while referring to the use history information; and a recording area changing section which changes a size ratio of a region or regions operating in the binary recording mode and a region or regions operating in the multi-level recording mode in the recording area so that at least the determined
(Continued)

data piece or pieces can be recorded in the binary recording mode.

26 Claims, 8 Drawing Sheets

(51) Int. Cl.
   *G11C 11/56* (2006.01)
   *G11C 16/10* (2006.01)
   *H04N 1/393* (2006.01)
   *G11C 16/34* (2006.01)
   *H04N 1/40* (2006.01)

(52) U.S. Cl.
   CPC ........ *G11C 16/349* (2013.01); *G11C 16/3495* (2013.01); *H04N 1/00832* (2013.01); *H04N 1/00891* (2013.01); *H04N 1/393* (2013.01); *H04N 1/40068* (2013.01); *G11C 2211/5641* (2013.01); *H04N 2201/0094* (2013.01)

(56) References Cited

U.S. PATENT DOCUMENTS

| | | | |
|---|---|---|---|
| 2008/0002467 A1 | 1/2008 | Tsuji | |
| 2008/0159650 A1* | 7/2008 | Odamaki | G06K 9/38 382/283 |
| 2008/0273395 A1* | 11/2008 | Sarin | G11C 11/5642 365/185.22 |
| 2011/0231687 A1* | 9/2011 | Takeyama | G06F 11/1441 713/324 |
| 2013/0061243 A1* | 3/2013 | Pillers | G06F 9/542 719/313 |

\* cited by examiner

FIG. 5

| KIND OF DATA | DATA SIZE (MB) | NUMBER OF ACCESS TIMES |
|---|---|---|
| COUNTER INFORMATION 1 | 1 | 10000 |
| COUNTER INFORMATION 2 | 1 | 25000 |
| COUNTER INFORMATION 3 | 1 | 2500 |
| COUNTER INFORMATION 4 | 1 | 0 |
| COUNTER INFORMATION 5 | 1 | 1500 |
| COUNTER INFORMATION 6 | 1 | 2000 |
| COUNTER INFORMATION 7 | 1 | 10000 |
| COUNTER INFORMATION 8 | 1 | 20000 |
| COUNTER INFORMATION 9 | 1 | 1000 |
| ... | ... | ... |
| COUNTER INFORMATION 150 | 1 | 10000 |

| TOTAL | 150 | 1230000 |
|---|---|---|

FIG. 6

| KIND OF DATA | THRESHOLD |
|---|---|
| COUNTER INFORMATION | 20000 |
| FUNCTION-SPECIFIC DATA | 3000 |

FIG. 7

| KIND OF DATA | REGION SIZE (MB) |
|---|---|
| COUNTER INFORMATION | 160 |
| FUNCTION-SPECIFIC DATA | 26000 |

FIG. 9

| KIND OF FUNCTION | DATA SIZE (MB) | NUMBER OF ACTIVATION TIMES |
|---|---|---|
| FUNCTION 1 | 100 | 150 |
| FUNCTION 2 | 15 | 200 |
| FUNCTION 3 | 10 | 300 |
| FUNCTION 4 | 150 | 100 |
| FUNCTION 5 | 2 | 50 |
| ... | ... | ... |
| FUNCTION 10 | 3 | 30 |

| TOTAL | 350 | 1200 |
|---|---|---|

FIG. 10

| KIND OF FUNCTION | THRESHOLD |
|---|---|
| FUNCTIONS 1 TO 4 | 200 |
| FUNCTIONS 5 TO 10 | 50 |

FIG. 11

| KIND OF FUNCTION | REGION SIZE (MB) |
|---|---|
| FUNCTIONS 1 & 4 | 300 |
| OTHERS THAN FUNCTIONS 1 & 4 | 50 |

FIG. 13

| KIND OF USER | DATA SIZE (MB) | NUMBER OF USE TIMES |
|---|---|---|
| USER 1 | 10 | 20 |
| USER 2 | 2 | 45 |
| USER 3 | 15 | 10 |
| USER 4 | 20 | 0 |
| USER 5 | 1 | 5 |
| ... | ... | ... |
| USER 10 | 2 | 15 |

| TOTAL | 110 | 130 |
|---|---|---|

FIG. 14

| KIND OF USER | THRESHOLD |
|---|---|
| USERS (GROUP A) | 20 |
| USERS (GROUP B) | 50 |

FIG. 15

| KIND OF USER | REGION SIZE (MB) |
|---|---|
| USERS (GROUP A) | 100 |
| USERS (GROUP B) | 50 |

IMAGE FORMING APPARATUS, CONTROL METHOD FOR FLASH MEMORY, AND NON-TRANSITORY COMPUTER-READABLE STORAGE MEDIUM

This application is based on Japanese Patent Application No. 2014-114588 filed on Jun. 3, 2014, in the Japan Patent Office, the entire content of which is hereby incorporated by reference.

TECHNICAL FIELD

The present invention relates to an image forming apparatus, a control method for a flash memory, and a non-transitory computer-readable storage medium storing a control program. In particular, the present invention relates to an image forming apparatus in which a flash memory is mounted, a control method of changing recording area of the flash memory, and a non-transitory computer-readable storage medium storing a control program for changing the recording area of the flash memory.

BACKGROUND

The number of image forming apparatuses employing a flash memory as a storage medium is in the increase. A flash memory is used for various purposes in image forming apparatuses. For example, a flash memory is used not only for storing programs, but also used as a buffer memory for buffering image data. In other words, a flash memory is also used for a purpose which causes the flash memory to frequently rewrite data in itself. On the other hand, due to miniaturization of semiconductor process rule (process size), the maximum number of times of rewriting data in a flash memory and a data retention period of a flash memory tend to decrease. Generally, when a flash memory has reached its usable life span (spare sectors have been exhausted), in many cases, the flash memory becomes a state of read-only (inhibition of rewriting). Under such a situation, it becomes difficult for an image forming apparatus using such a flash memory, to respond to a user's request.

In view of the situation, as some sort of flash memory, there has been provided a memory device capable of switching its data recording mode between a mode of recording data such that each memory cell stores multi-valued data (such a cell is referred to as a MLC or multi-level cell) and a mode of recording data such that each memory cell store binary data (such a cell is referred to as a SLC or single-level cell). The mode of recording multi-valued data allows a flash memory to record a large amount of data, and the mode of recording binary data increases the number of times that data can be written to a flash memory and prolongs a data retention period of a flash memory.

With regard to such a device, for example, Japanese Unexamined Patent Publication (JP-A) No. 2009-48680 discloses a storage device which includes one or more non-volatile semiconductor memories each including a memory array, and a controller. The memory array includes multiple memory cells in each of which multiple thresholds at respective voltage levels are established so that two or more bits of data can be stored. The controller is configured to give operation instructions to the non-volatile semiconductor memory on the basis of a command issued by an external device. The non-volatile semiconductor memory includes a block administering table which contains binary/multi-valued data writing information, where the binary/multi-valued data writing information indicates whether to store data as binary data or multi-valued data at the time of writing the data into the non-volatile semiconductor memory. The controller writes data into the non-volatile semiconductor memory while referring to the binary/multi-valued data writing information in the block administering table.

Further, JP-A No. 2009-64394 discloses an access control apparatus which is connected to an external device, a first memory for storing data to be accessed by the external device, and a second memory for storing the data, where the second memory is greater in the number of rewritable times of the data than that of the first memory. The access control apparatus includes a table storing section to store a conversion table, a judging section, a moving section, and a table updating section. In the conversion table, an external address, an internal address, and the number of rewriting times of the data are correlated with each other, where the external address is designated so that the external device can access the data, and the internal address indicates one of a location where the data is stored in the first memory and a location where the data is stored in the second memory. The judging section judges whether the internal address correlated with the external address designated as a location to which data is to be written, is the internal address in the first memory. In the case where the internal address is the internal address in the first memory, the judging section judges whether the number of rewriting times correlated with the internal address exceeds a prescribed first threshold. The moving section moves the data stored at the internal address in the first memory, at which the number of rewriting times has exceeded the first threshold, to the internal address of the second memory. The table updating section updates the conversion table by replacing the internal address correlated with the external address of the moved data, with the internal address of a moving destination.

According to the technique of the above-mentioned JP-A No. 2009-48680, a memory controller counts up and administrates the number of times of data writing, and when the number of times of data writing in a certain block becomes equal to or more than a prescribed value, the memory controller records the data in a region where data is stored as binary data. Recording high frequently written data as binary data allows the storage device to secure the reliability of stored data. The technique of JP-A No. 2009-48680 is directed to a storage device, and even if the way to record data is changed according to the number of times of data writing, it could not cause any problem in the storage device itself. However, in the case of an apparatus which executes processing by using data stored in a flash memory, an amount of data written into the flash memory changes according to an operating state of the apparatus. Therefore, the change of the way to record data reduces the available capacity of the flash memory, and such a change can cause a trouble in operation of the apparatus.

Further, as disclosed in JP-A No. 2009-64394, the disclosed technique uses plural kinds of device, such as a MLC, a SLC, and a FeRAM (Ferroelectric Random Access Memory), disposed in an apparatus, and prolongs the data retention period by moving data recorded at the internal address at which the number of times of data writing exceeds a threshold, to the internal address of SLC or FeRAM exhibiting the maximum number of times of data rewriting which is relatively great. However, since this technique needs a preparation of plural kinds of device, such as MLC, SLC, and FeRAM, it makes the constitution of the apparatus complicated and increases the cost Further, this technique needs, at the time of reading data recorded as multi-valued data, a process to convert the multi-valued data into binary data. Such a process may lower the performance of a function of the apparatus which operates by using data recorded as multi-valued data.

In this way, it is desirable to record data as multi-valued data in order to record a large amount of data, and is desirable to record data as binary data in order to enhance the reliability of recorded data and the performance of a function of an apparatus using the recorded data. However, the conventional method hardly satisfied the both demands, which was a problem. The present invention seeks to solve the problem.

SUMMARY

There are disclosed illustrative image forming apparatuses, illustrative control methods, and non-transitory computer-readable storage media each storing a control program.

An illustrative image forming apparatus reflecting one aspect of the present invention is an image forming apparatus comprising a flash memory including a recording area in which a data recording mode can be regionally switched between a multilevel recording mode in which each memory cell stores more than one bit of data and a binary recording mode in which each memory cell stores one bit of data. The image forming apparatus further comprises a history information creating section which monitors a usage state of the image forming apparatus to create and store use history information. The image forming apparatus further comprises a determining section which determines a piece or pieces of data which are higher in use frequency than other pieces of data, among data pieces recorded in the flash memory, while referring to the use history information. The image forming apparatus further comprises a recording area changing section which changes a size ratio of a region or regions where data is stored in the binary recording mode and a region or regions where data is stored in the multilevel recording mode in the recording area of the flash memory so that the flash memory can record the at least the piece or pieces of data determined by the determining section, in the binary recording mode.

An illustrative control method reflecting one aspect of the present invention is a control method for a flash memory in an image forming apparatus. The flash memory includes a recording area in which a data recording mode can be regionally switched between a multilevel recording mode in which each memory cell stores more than one bit of data and a binary recording mode in which each memory cell stores one bit of data. The method comprises monitoring a usage state of the image forming apparatus to create and store use history information; and determining a piece or pieces of data which are higher in use frequency than other pieces of data, among data pieces recorded in the flash memory, while referring to the use history information. The method further comprises changing a size ratio of a region or regions where data is stored in the binary recording mode and a region or regions where data is stored in the multilevel recording mode in the recording area of the flash memory so that the flash memory can record the at least the determined piece or pieces of data, in the binary recording mode.

An illustrative non-transitory computer-readable storage medium reflecting one aspect of the present invention stores a control program to be executed in an image forming apparatus which includes a flash memory. The flash memory includes a recording area in which a data recording mode can be regionally switched between a multilevel recording mode in which each memory cell stores more than one bit of data and a binary recording mode in which each memory cell stores one bit of data. The control program, when being executed by a processor of the image forming apparatus, causes the image forming apparatus to perform the following processing. The processing comprises monitoring a usage state of the image forming apparatus to create and store use history information; and determining a piece or pieces of data which are higher in use frequency than other pieces of data, among data pieces recorded in the flash memory, while referring to the use history information. The processing further comprises changing a size ratio of a region or regions where data is stored in the binary recording mode and a region or regions where data is stored in the multilevel recording mode in the recording area of the flash memory so that the flash memory can record the at least the determined piece or pieces of data, in the binary recording mode.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which:

FIG. 5 illustrates an example of a counter information table in relation to Example 1;

FIG. 6 illustrates an example of a table of thresholds of the number of data access times in relation to Example 1;

FIG. 7 illustrates an example of a flash memory region table in relation to Example 1;

FIG. 9 illustrates an example of a function-use history table in relation to Example 2;

FIG. 10 illustrates an example of a table of thresholds of the number of function activation times in relation to Example 2;

FIG. 11 illustrates an example of a flash memory region table in relation to Example 2;

FIG. 13 illustrates an example of a user-use history table in relation to Example 3;

FIG. 14 illustrates an example of a table of thresholds of the number of use times in relation to Example 3; and FIG. 15 illustrates an example of a flash memory region table in relation to Example 3.

DETAILED DESCRIPTION

Figure 1:
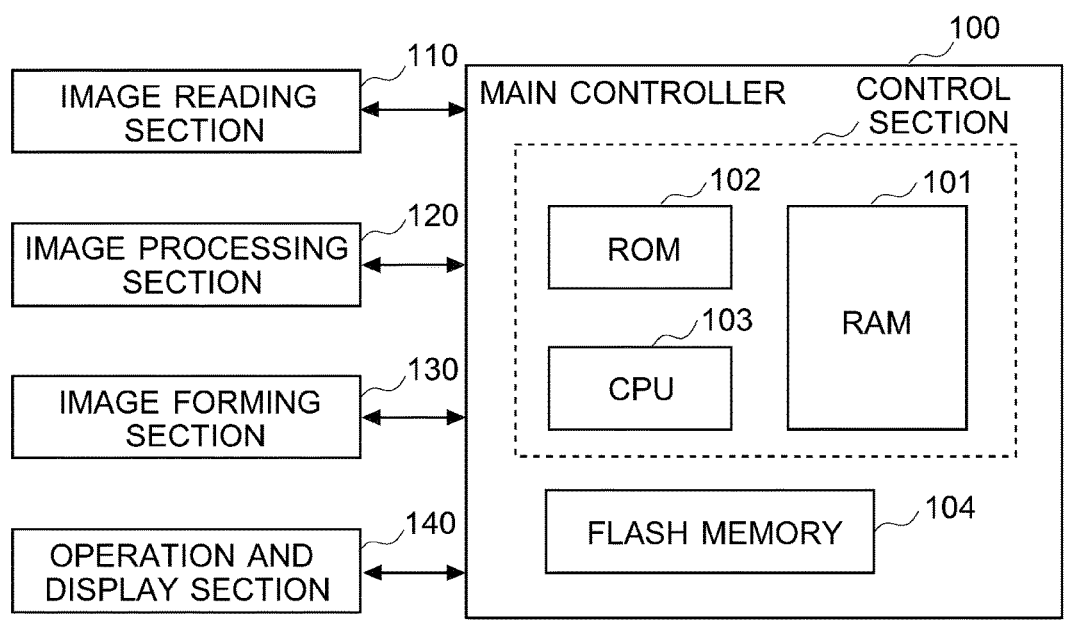
FIG. 1 is a block diagram illustrating a constitution of an image forming apparatus in relation to Example 1.

Illustrative embodiments of image forming apparatuses, control methods, and non-transitory computer-readable storage media each storing a control program will he described with reference to the drawings. It will be appreciated by those of ordinary skill in the art that the description given herein with respect to those figures is for exemplary purposes only and is not intended in any way to limit the scope of potential embodiments may be resolved by referring to the appended claims.

According to the illustrative image forming apparatuses, control methods, and non-transitory computer-readable storage media, an image forming apparatus which uses a flash memory as a memory, is allowed to hold data necessary for operation of each function of the apparatus and further to exhibit enhanced reliability of data and enhanced performance of each function of the apparatus.

The reasons of the above are as follows. An illustrative image forming apparatus includes a flash memory wherein a data recording mode can be regionally switched between a multilevel recording mode in which each memory cell stores more than one bit of data and a binary recording mode in which each memory cell stores one bit of data. The image forming apparatus is capable of controlling the recording mode of the flash memory such that data can be recorded in the multilevel recording mode or the binary recording mode. The image forming apparatus conducts a control to refer use history information about, for example, each piece of data, each function or each user, stored in advance; determine a piece or pieces of data which are relatively high in use frequently among data pieces recorded in the flash memory, on the basis of the use history information; and change the size ratio of a region or regions recording data as binary data (SLC region) and a region or regions recording data as multi-valued data (MLC region) in the recording area of the flash memory so as to allow the flash memory to record the at least the piece or pieces of data determined, in the binary recording mode.

Generally, a flash memory is composed of MOS (Metal Oxide Semiconductor) transistors (corresponding to memory cells), and each MOS transistor includes gate electrodes in a two-layer structure. There are two main types of flash memory, which are a NOR type flash memory and a NAND type flash memory. A NOR type flash memory can read, write, delete, and rewrite its content one byte at a time, since each cell is connected a source line and a bit line. A NAND type flash memory can read, write, delete, and rewrite its content plural bytes at a time, since plural cells are connected in series between a source line and a bit line. In both types, by applying a high electric field between a floating gate of a MOS transistor and a silicon substrate, electrons pass through a gate insulating film with a tunneling effect and are injected into the floating gate, which changes the gate voltage (threshold voltage) at which the MOS transistor is switched from OFF state to ON state. The both types of flash memory store information in itself using this feature.

Accordingly, the increased number of times of writing data into a flash memory causes deterioration of the gate insulating film because of tunnel injection of electrons. Therefore, electrons injected into the floating gate tend to run into the silicon substrate more, and thus the data retention period is shortened. In particular, a NAND type flash memory carries out data writing on one whole memory block at a time even for writing data into a part of cells in a memory block. It substantially increases the number of times of data writing in the flash memory, and deterioration of the gate insulating film worsens, and thus the data retention period is shortened. Further, due to miniaturization of the semiconductor process rule, the maximum number of times of data writing for a flash memory and a data retention period of a flash memory tend to furthermore decrease.

In view of that, there has been provided a control to record frequently written data as binary data. An apparatus employing such a control uses multiple kinds of device including a device capable of recoding data as multi-valued data and a device capable of recording data as binary data. However, the constitution of the apparatus may become complicated, which may cause a rise of the cost. Accordingly, it becomes difficult to apply such a control to an apparatus requested to reduce cost. Further, if an apparatus which operates on the assumption about the original capacity of a flash memory, employs a control to change its data recording mode simply according to the number of times of data writing, such a control can cause a trouble in operation of the apparatus.

Here, description is given in full detail to the trouble in actions. In the case of controlling a memory as a single item, a control to switch between a way to record data as binary data and a way to record data as multi-valued data, simply according to the number of times of writing the data, could not cause any problem. On the other hand, in the case where a flash memory is used by being incorporated in an apparatus, it is necessary to consider the operation state of the apparatus. In particular, in the case of an apparatus which uses a flash memory as a buffer of image data, for example, an image forming apparatus like a MFP (Multi-Function Peripheral), a change of the way to record data as multi-valued data to the way to record data as binary data, reduces the amount of data which can be recorded in each memory cell in the flash memory. Under such a situation, the apparatus uses an increased number of memory cells of the flash memory and it reduces a usable region of the flash memory. Therefore, the flash memory sometimes cannot record all of image data obtained through a scanner or obtained by rasterization of data of pages of print data, and it can cause various troubles such as a delay of scanning actions and a delay of print actions of the apparatus.

Further, in the case where the flash memory in the apparatus records data as multi-valued data, the apparatus needs a process to convert the multi-valued data into binary data, in order to read and use the recorded data. Such a process may lower the performance of a function of the apparatus which operates by using data recorded as multi-valued data.

In this way, it is desirable to record data as multi-valued data in order to record a large amount of data, and is desirable to record data as binary data in order to enhance the reliability of recorded data and the performance of a function using the recorded data. Which one of them is better for recording may change depending on the operation condition of the apparatus. In view of the reliability of data and the performance of a function of the apparatus, the apparatus may employ a control to record data, which was recorded as multi-valued data, as binary data, but with such a simple control, the apparatus cannot operate appropriately. It is demanded to propose a method of recording data appropriately in accordance with the operation state of an apparatus without making a constitution of the apparatus complicated.

In view of that, according to one embodiment of the present invention, the usage state of the apparatus is monitored, and the monitoring result is stored as use history information about, for example, each piece of data, each function the apparatus, or each user. At the time of starting up or shutdown of the apparatus, or at the time when the apparatus is in nonuse, such as night time, the apparatus determines relatively high frequently used data among data pieces recorded in the flash memory on the basis of the use history information which has been stored in advance, and changes the recording area of the flash memory (to change the size ratio of a region or regions where data is stored in the binary recording mode and a region or regions where data is stored in in the multilevel recording mode) so that the flash memory can record the determined data in the binary recording mode.

The control enhances the reliability of relatively high frequently used data, and also enhances the data access performance of the flash memory on reading and writing such data (in other words, a performance of a function of the apparatus using such data). The control further minimizes a reduction of available capacity of the flash memory and secures a record of data to be used by other functions into the flash memory.

EXAMPLES

Example 1

Figure 2:
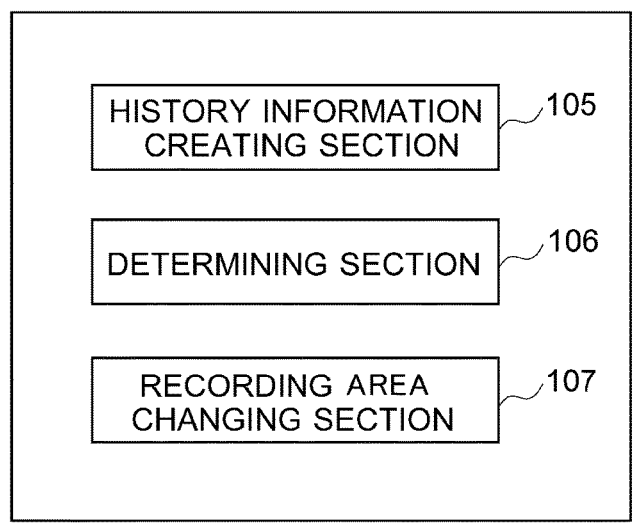
FIG. 2 is a block diagram illustrating a constitution of a control section of the image forming apparatus in relation to Example 1.
Figure 3:
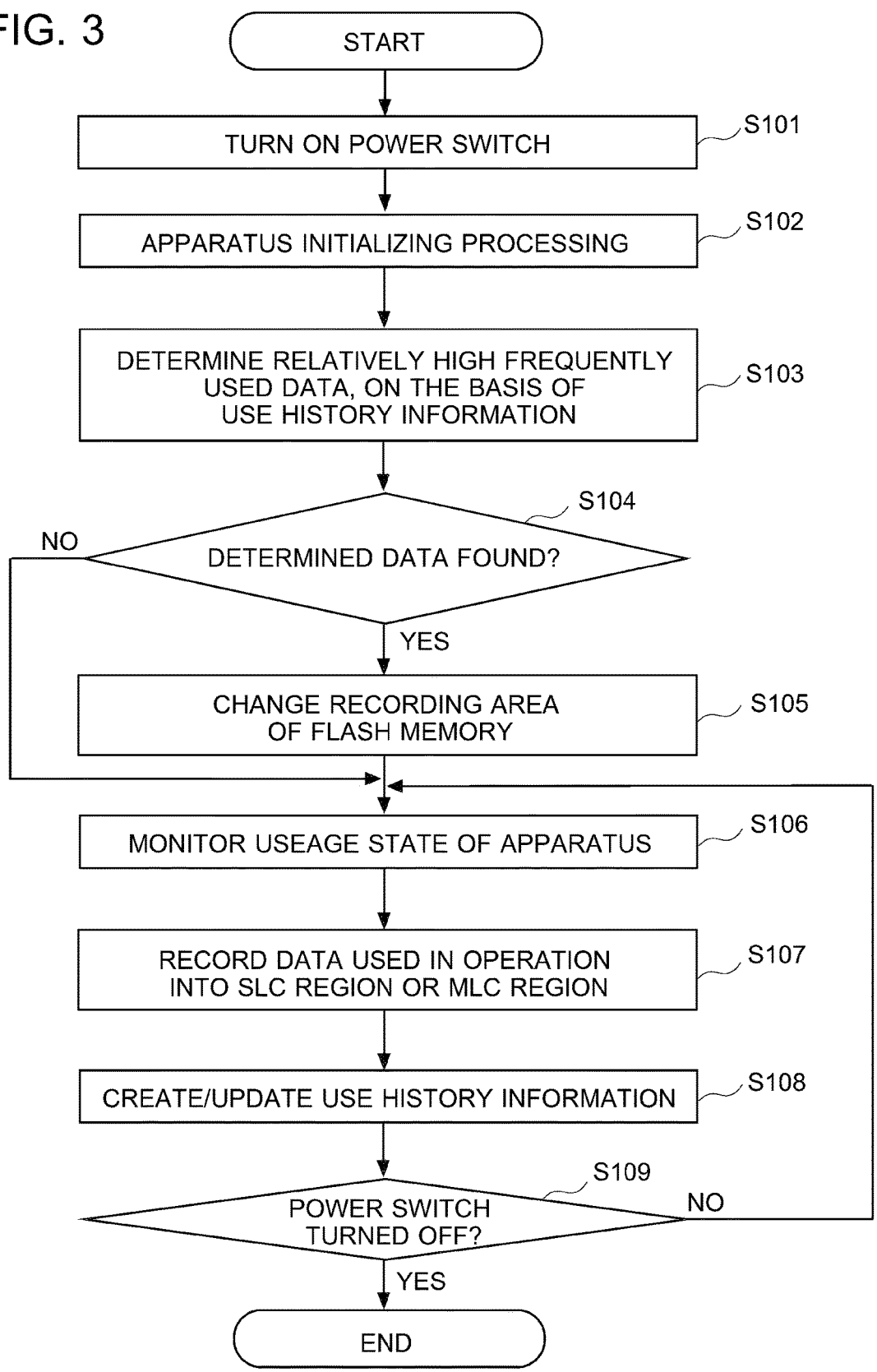
FIG. 3 is a flowchart illustrating operation of the image forming apparatus in relation to Example 1.
Figure 4:
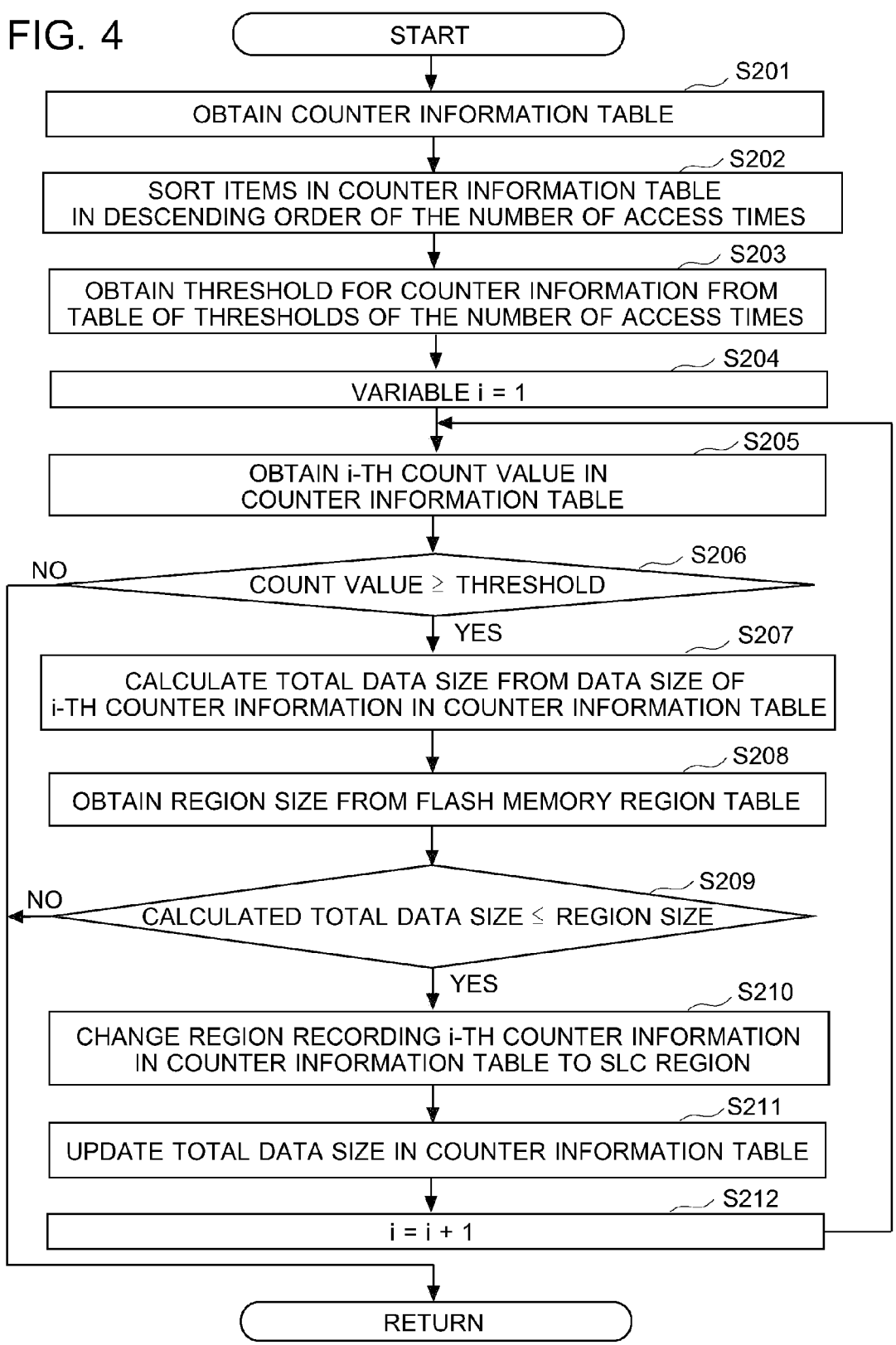
FIG. 4 is a flowchart illustrating operation (a process of changing a recording area of a flash memory on the basis of a use frequency of data) of the image forming apparatus in relation to Example 1.

In order to describe more in detail the above embodiments of the present invention, description is given to image forming apparatuses, control methods for a flash memory, and computer-readable recording media each storing a control program, in relation to Example 1, with reference to FIG. 1 to FIG. 7. FIG. 1 is a block diagram illustrating a constitution of an image forming apparatus of the present example, and FIG. 2 is a block diagram illustrating a constitution of a control section of the image forming apparatus. Each of FIG. 3 and FIG. 4 is a flowchart illustrating operation of the image forming apparatus of the present example. FIG. 5 to FIG. 7 illustrate an example of a counter information table, a table of thresholds of the number of data access times, and a flash memory region table, respectively.

The present example uses an image forming apparatus like a MFT (Multi-Function Peripheral), which is a specific example of an information processing apparatus. This image forming apparatus includes, as illustrated in FIG. 1, a main controller 100, an image reading section 110, an image processing section 120, an image forming section 130, and an operation and display section 140.

The main controller 100 includes a RAM (Random Access Memory) 101, a ROM (Read Only Memory) 102, a CPU (Central Processing Unit) 103, and a flash memory 104.

The CPU 103, ROM 102 and RAM 101 form a control section. The control section receives a user's operation through the operation and display section 140, and executes predetermined control for the image reading section 110, the image processing section 120, the image forming section 130, the operation and display section 140, and the flash memory 104. Further, the control section works as a history information creating section 105, a determining section 106, and a recording area changing section 107, as illustrated in FIG. 2.

The history information creating section 105 monitors access to pieces of data recorded in the flash memory 104 (a usage state of the image forming apparatus), determines the kind of each piece of data read from or written into the flash memory 104 while referring to the filename extension of each piece of the data and property information added to each piece of the data, and obtains the size of each piece of data and the number of access times of each piece of data. Further, the history information creating section 105 creates use history information for each kind of data pieces, on the basis of the obtained information, and stores the use history information in the RAM 101.

The determining section 106 determines the use frequency of each piece of data in the flash memory 104 by referring to the use history information, for each type of data pieces, and determines a high frequently used piece or pieces of data (which are higher in use frequency than the other pieces of data) among data pieces recorded in the flash memory 104. At this time, the determining section 106 may determine the use frequency of pieces of data successively until the total data size of the determined piece or pieces of data exceeds a predetermined region size. For example, the determining section 106 compares the number of access times of each piece of data with a predetermined threshold, and further compares the total data size of the pieces of data each of which is equal to or larger than the threshold in the number of access times, with a predetermined region size. Thereby, the determining section 106 determines a piece or pieces of data the number of access times of which is equal to or more than the threshold and total data size of which is equal to or less than the region size. Here, there is no need for the determining section 106 to determine the use frequency for all the pieces of data handled by the image forming apparatus. Important data such as program data and setting data of the image forming apparatus may be excluded from a target of determining the use of frequency (pieces of data from which the use frequency is to be determined).

The recording area changing section 107 changes a size ratio of a SLC region and a MLC region in a recording area of the flash memory 104 so as to allow the flash memory 104 to record the piece or pieces of data determined by the determining section 106 in the binary recording mode, where the SLC region is a region or regions where data is recorded in a binary recording mode in which each memory cell stores one bit of data, and the MLC region is a region or regions where data is recorded in a multi-level recording mode in which each memory cell stores more than one bit of data. In concrete terms, the recording area changing section 107 dynamically changes the size ratio of the SLC region and the MLC region of the flash memory 104 so that relatively high frequently used data pieces can be recorded as binary data and the other data pieces can be recorded as multi-valued data. At that time, in the case where the SLC region includes a piece or pieces of data recorded beforehand, the recording area changing section 107 moves the piece or pieces of data to the MLC region of the flash memory 104 or to a certain memory device, temporarily before the changing the size ratio, and returns the moved piece or pieces of data into the SLC region after changing the size ratio. The certain memory device is a memory device other than the flash memory and can be a memory device incorporated in or externally mounted on the image forming apparatus, such as the RAM 101 and a non-illustrated HDD (Hard Disk Drive). Although it is preferable that the SLC region records only the determined piece or pieces of data, the SLC region may further record the above-described important data such as program data and setting data of the image forming apparatus.

The above history information creating section 105, the determining section 106, and the recording area changing section 107 may be provided as hardware devices. Alternatively, the history information creating section 105, the determining section 106, and the recording area changing section 107 may be provided by a control program which causes the control section of the image forming apparatus to function as these sections when being executed. That is, the control section may be configured to serve as the history information creating section 105, the determining section 106, and the recording area changing section 107, when CPU 103 executes the control program.

The flash memory 104 is a device for recording data, such as scanning data, copy data, print data, facsimile data, counter information and others. The flash memory 104 has a structure (MLC structure) such that each memory cell in a recording area can store more than one bit of data. The flash memory 104 is configured to change a data recording mode of a part of the recording area such that each memory cell in the part can store one bit of data, in response to an instruction given by the record area changing section 107. As an example, an eMMC (embedded Multi Media Card) can change the data recording mode such that a part or the whole of its recording area can store one bit of data per memory cell, and is preferably used as flash memory 104 of the present example.

Further, as illustrated in FIG. 1, the image reading section 110, the image processing section 120, and the image forming section 130 are controlled by the main controller 100 so as to provide the functions as an image forming apparatus.

In concrete terms, the image reading section 110 is a part to read image data optically from a document placed on an original platen, and includes a light source to scan a document, an image sensor, such as CCDs (Charge Coupled Devices), to convert the light reflected on the document into electrical signals, and an A/D converter to perform A/D conversion on the electrical signals. The image reading section 110 outputs image data read from the document to the main controller 100

The image processing section 120 performs image processing, such as edge enhancement processing, smoothing processing, color conversion processing, on the image data of the document read by the image reading section 110. Further, in the case where the image processing section 120 obtains print data described in PDL (Page Description Language) represented by PostScript and PCL (Printer Control Language) from another device, the image processing section 120 rasterizes respective pages contained in the print data so as to produce image data for each page, and performs the above image processing on the produced image data. Subsequently, the image processing section 120 outputs the image data having been subjected to the image processing to the main controller 100.

The image forming section 130 performs print processing onto a paper sheet by using the image data subjected to the image processing by the image processing section 120. In concrete terms, in the case that the image forming section 130 employs an electrophotographying system, the image forming section 130 performs the following processes. The image forming section 130 causes an exposing device to emit light corresponding to an image onto a photoreceptor drum electrically charged by an electrically charging device, to form an electrostatic latent image on the photoreceptor drum. Successively, the image forming section 130 causes a developing device to make electrically charged toner stick onto the photoreceptor drum to develop the latent image and form a toner image. Then, the image forming section 130 primarily transfers the toner image to a transfer belt, secondarily transfers the toner image from the transfer belt to a paper sheet, and further performs fixing processing so to fix the toner image on the paper sheet by a fixing device.

The operation and display section 140 includes, for example, a touch panel and hard keys. The touch panel includes a display section like a LCD (Liquid Crystal Display), and an operation section like a touch sensor, where the operation section is constituted by lattice-shaped transparent electrodes and arranged on the display section. The operation and display section 140 displays an operation screen of an image forming apparatus, to receive a user's operation performed on the operation screen and to output signals corresponding to the user's operation to the main controller 100.

The present example uses an information processing apparatus, which is concretely an image forming apparatus like a MFP, and the image forming apparatus includes the image reading section 110, the image processing section 120, and the image forming section 130. However, the above structural elements are not essential, and the image forming apparatus can be a single functional printer which does not have the image reading section 110, or can be a printer controller or a RIP (Raster Image Processor) controller which does not have the image reading section 110 and the image forming section 130. Alternatively, the image forming apparatus can be a facsimile machine equipped with a communication function via a telephone line.

Next, description is given to operation of the image forming apparatus in the present example with reference to FIG. 3 and FIG. 4. A control program is stored in a storage device such as the ROM 102 and the flash memory 104, and, when being executed by the CPU 103, causes the image forming apparatus to perform processes of steps illustrated in the flowchart of FIG. 3 and the flowchart of FIG. 4. Here, it is assumed that a counter information table mentioned later is created beforehand by the history information creating section 105 and is stored in the RAM 101.

There is provided an image forming apparatus being in a power OFF state and its power switch is turned ON by a user (S101). When power is supplied to the image forming apparatus, the main controller 100 executes apparatus initializing processing (S102). At a completion of the apparatus initializing processing, the main controller 100 controls the operation and display section 140 to display a user interface so as to allow a user to operate the image forming apparatus through the operation and display section 140.

Next, the main controller 100 (determining section 106) checks the use frequency of a certain type of pieces of data, on the basis of use history information recorded beforehand, and determines a piece or pieces of data which are higher in use frequency than the other pieces of data (S103). When finding a high frequently used piece or pieces of data determined by the determining section 106 (YES at S104), the main controller 100 (recording area changing section 107) changes the recording area of the flash memory 104 (changes the size ratio of the SLC region and the MLC region) (S105). The processes in S103 to S105 will be described in detail later.

Subsequently, the main controller 100 (history information creating section 105) monitors the usage state (for example, access to data pieces stored in the flash memory 104 and a user's operation performed on the operation and display section 140) of the image forming apparatus (S106). When the image forming apparatus operates in response to a user's instruction, the main controller 100 records a piece of data handled in the operation into the SLC region or the MLC region (S107). In concrete terms, the main controller 100 controls record processing so as to record a piece of data determined at S103 in the SLC region in the binary recording mode and to record the other data in the MLC region in the multi-level recording mode. Then, the main controller 100 (history information creating section 105) obtains the data size and the number of access times of the piece of data handled or used in the operation, and creates or updates the use history information regarding the above operation, on the basis of the obtained information (S108). Successively, the main controller 100 determines whether the power switch is turned OFF by a user (S109), and the main controller 100 repeats the processes in S106 to S109 until the power switch is turned OFF.

In FIG. 3, the recording area of the flash memory 104 is changed at the time of starting up of the image forming apparatus (after the initializing processing). However, the change of the recording area may be executed at a time except the time when data in the flash memory 104 is accessed frequently. For example, the main controller 100 may execute the change of the recording area on a shutdown of the image forming apparatus or at a time when no instruction about processing is given to the image forming apparatus (for example, at a time when the image forming apparatus is in nonuse, like night time).

Next, description is given concretely to a process (processes at S103 to S105 in FIG. 3) to determine a high frequently used piece or pieces of data and to change the recording area of the flash memory 104 such that the determined piece or pieces of data can be recorded in the SLC region.

The image forming apparatus updates many kinds of counter information in parallel to the processing of each of functions of the image forming apparatus, such as scanning, copying, printing, and faxing. Examples of the counter information include information of a counter of the number of feeding sheets, information of a counter of fees for each of color prints and monochrome prints, information of a counter of a life span of each consumable article, information of a counter of activation frequency of each function of the image forming apparatus. To update those kinds of counter information, it is necessary for the image forming apparatus to access the flash memory 104, which can result in long access time. As data to be recorded in the flash memory 104, attention is paid to counter information, and the image forming apparatus conducts a control to record a kind of counter information which is relatively high in use frequency into the SLC region. Hereafter, description is given in detail to this control with reference to the flowchart illustrated in FIG. 4 and the tables illustrated in FIGS. 5 to 7.

First, the main controller 100 (determining section 106) obtains use history information (counter information table) stored beforehand in the RAM 101 (S201). FIG. 5 illustrates an example of a counter information table, wherein the names of plural kinds of counter information (here, counter information 1 to 150) handled in the image forming apparatus have been recorded beforehand in the column of kind of data, the data size of each kind of counter information is recorded in the column of data size, and the number of access times of the counter information counted during an arbitrary period is recorded in the column of the number of access times. The number of access times can be the number of access times counted during the whole period (the period from the time when the apparatus was installed or the apparatus was reset, to the present time), or the number of access times counted during a prescribed period (for example, the latest one month or one year). In the case of using the number of access times counted during a prescribed period, the values in the column of the number of access times may be reset after the prescribed period has elapsed. Further, to administer data other than the counter information, for example, function-specific data, such as data written in PDL (Page Description Language) represented by PostScript and PCL (Printer Control Language) and raster data, the similar table may be also created for the function-specific data.

Next, the main controller 100 (determining section 106) sorts items in the counter information table in the descending order of the number of access times (S202). In the case of sorting the counter information in FIG. 5, sorting the items in the descending order of the number of access times results in that counter information 2, counter information 8 . . . and counter information 4 are arrayed in this order.

Next, the main controller 100 (determining section 106) obtains a threshold of the number of access times for the counter information from a table of thresholds of the number of access times (S203). FIG. 6 illustrates an example of a table of thresholds of the number of access times. In the present example, the main controller 100 obtains "20000" as the threshold for the counter information. In the case where there is another use history information of data (for example, function-specific data) other than the counter information, the main controller 100 obtains the threshold for the data (for example, "3000" as the threshold for the function-specific data).

Next, the main controller 100 (determining section 106) sets "1" to variable i (S204), and then obtains the i-th count value (the number of access times) in the sorted counter information table (S205).

Next, the main controller 100 (determining section 106) compares the count value obtained at S205 with the threshold obtained at S203 (S206). If the i-th count value is less than the threshold, a series of the processes is ended because the counter information concerned is not expected to be used so frequently. On the other hand, if the i-th count value is equal to or larger than the threshold, the main controller 100 (determining section 106) calculates the total data size from the data size of the i-th counter information of the counter information table (by adding the i-th data size to the current total data size) because the counter information concerned is expected to be used frequently (S207).

Next, the main controller 100 (determining section 106) obtains a region size set beforehand for the counter information from the flash memory region table (S208). FIG. 7 illustrates an example of the flash memory region table. In this case, the main controller 100 obtains "160 MB" as a region size corresponding to the counter information. Then, the main controller 100 (determining section 106) compares the total data size calculated at S207 with the region size obtained at S208 (S209).

If the calculated total data size is larger than the region size, a series of the processes is ended because switching the data recording mode for the calculated size of data can result in that the data presses the recording area of the flash memory 104 and it can cause a trouble in recording another data. That is, under the condition that many kinds of the counter information are high frequently used, and that it is considered that recording all the kinds of counter information in the SLC region may arise a shortage of a region for recording other data and may make the image forming apparatus difficult to provide its features, the main controller 100 does not change the region storing a piece of data concerned to the SLC region, and leaves the region the MLC region. On the other hand, if the calculated total data size is equal to or less than the obtained region size, the main controller 100 (recording area changing section 107) changes the region storing the i-th counter information in the counter information table to the SLC region (S210). At that time, in the case where the SLC region stores a piece or pieces of data previously recorded, the recording area changing section 107 temporarily moves the data to the MLC region or to a certain memory device, and returns the moved data to the SLC region after changing the recording mode of the region (that is, after changing the size ratio of the regions), where the certain memory device is other than the flash memory 104 and is incorporated in or externally mounted on the image forming apparatus.

Successively, the main controller 100 (determining section 106) updates the value of the field of total data size in the counter information table (S211), and increases the value of variable i by 1 (S212). Subsequently, the main controller 100 returns to S205, and executes repeatedly the processes at S206 to S211 on all items of the counter information in the counter information table.

By executing the above processes repeatedly, only the region or regions storing a relatively high frequently used piece or pieces of data (here, counter information) are changed to the SLC region or regions, the reliability and accessing speed of relatively high frequently used data can be enhanced without pressing the recording area of the flash memory 104.

Example 2

Figure 8:
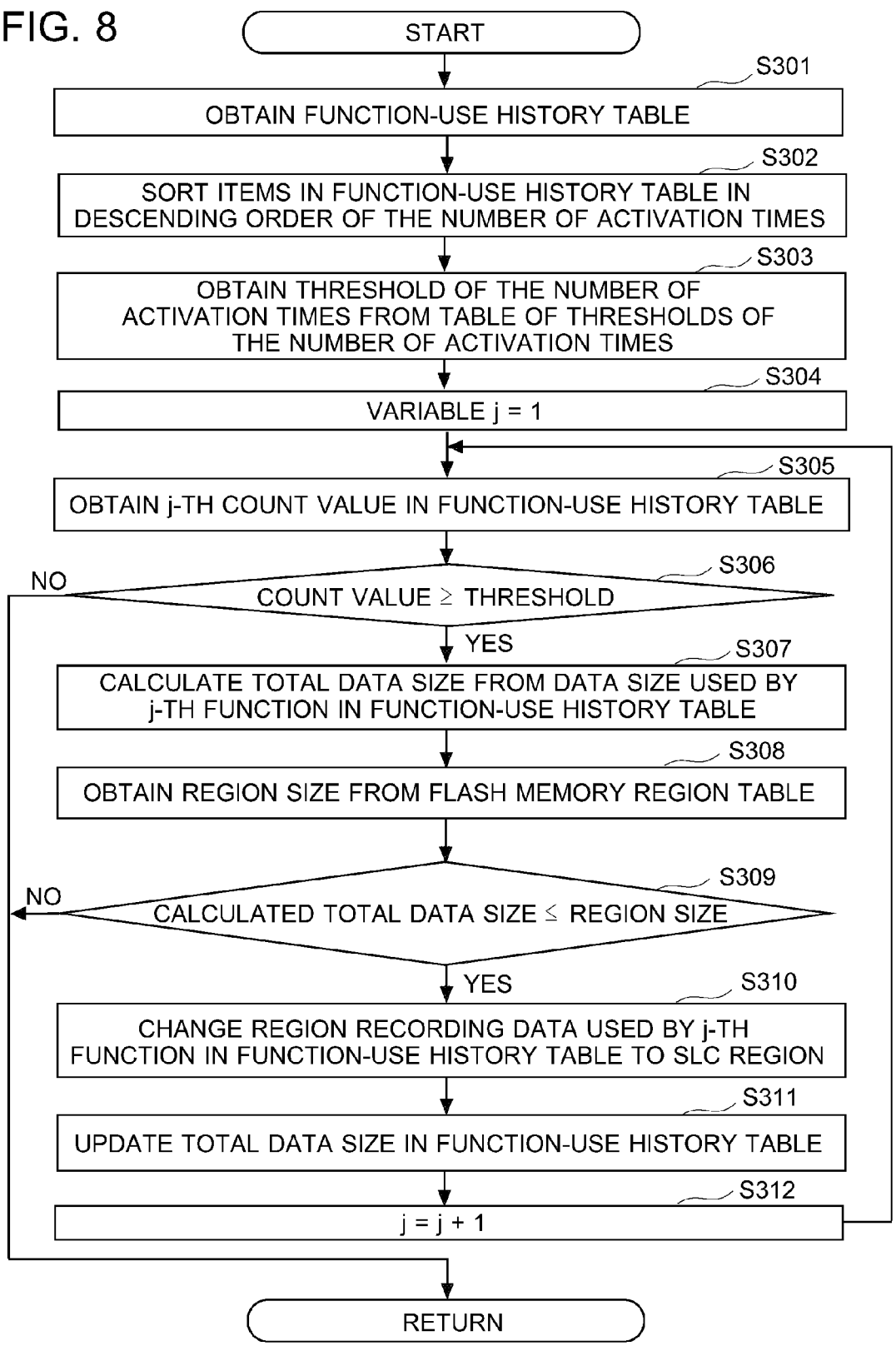
FIG. 8 is a flowchart illustrating operation (a process of changing a recording area of a flash memory on the basis of a use frequency about a function) of the image forming apparatus in relation to Example 2.

Next, description is given to an image forming apparatus, a control method for a flash memory, and a control program in relation to Example 2 with reference to FIG. 8 to FIG. 11. FIG. 8 is a flowchart illustrating operation of the image forming apparatus of the present example. FIG. 9 to FIG. 11 illustrate an example of a function-use history table, a table of thresholds of the number of activation times, and a flash memory region table, respectively.

In Example 1 mentioned above, description is given to a control to determine relatively high frequently read or written data, and then change the recording area of the flash memory 104 such that the determined data can be recorded in the SLC region. The image forming apparatus holds pieces of data (function-specific data) separately for its functions so that multiple functions (scanning, copying, printing, and faxing) can be activated simultaneously. That is, pieces of data read from or written into the flash memory 104 are associated with corresponding functions. In view of that, the present example provides a control to determine a function or functions which are relatively high in activation frequency (a relatively high frequently activated function), and change the recording area (the size ratio of recording regions) so as to allow the flash memory 104 to record a piece or pieces of data used for the determined function or functions in the SLC region. In that case, although the basic constitution of each of the image forming apparatus and the control section is the same as that in FIG. 1 and FIG. 2 respectively in Example 1, operation of the control section is different from that in Example 1.

In concrete terms, the history information creating section 105 monitors user's operations performed on in the operation and display section 140, determines the designated function on the basis of operation information, and obtains the data size of a piece or pieces of data used by the function and the number of activation times of the function. Further, the history information creating section 105 creates and stores the use history information for each function.

Further, the determining section 106 determines a use frequency of each function while referring to the use history information of each function, and determines a relatively high frequently activated function, to determine a piece or pieces of data used by the function. For example, in the case where a certain function is high frequently activated, the determining section 106 determines a piece or pieces of data handled at the time of activating the function (for example, print data used by a printing function, scan data used by a scanning function, and facsimile data used by a facsimile function) as relatively high frequently used data.

Hereafter, description is given to the above control with reference to the flowchart illustrated in FIG. 8 and a table illustrated in each of FIG. 9 to FIG. 11. A control program is stored in a storage device such as the ROM 102 and the flash memory 104, and, when being executed by the CPU 103, causes the image forming apparatus to perform processes of steps illustrated in a flowchart of FIG. 8. Since the basic operation of the image forming apparatus is the same as that in FIG. 3 in Example 1, description is omitted.

First, the main controller 100 (determining section 106) obtains use history information (function-use history table) stored beforehand in the RAM 101 (S301). FIG. 9 illustrates an example of a function-use history table, wherein plural functions (here, Functions 1 to 10) implemented in the image forming apparatus are recorded beforehand in the column of kind of function, the size of data used at the time of activating each function is recorded in the column of data size, and the number of activation times of each function during an arbitrary period is recorded in the column of the number of activation times. The data size in the table can be the size of data used at the time of activating the function operate at the last time, or the average value, the maximum value or the minimum value of data sizes obtained by several activations of the function. The number of activation times can be the number of activation times during the whole period (the period from the time when the apparatus was installed or the apparatus was reset, to the present time), or the number of activation times during a prescribed period (for example, the latest one month or one year). In the case of using the number of activation times during a prescribed period, the values in the column of the number of activation times may be reset after the prescribed period has elapsed.

Next, the main controller 100 (determining section 106) sorts items in the function-use history table in the descending order of the number of activation times (S302). In the case of FIG. 9, sorting the items in the descending order of the number of activation times results in that Function 3, Function 1 . . . are arrayed in this order.

Next, the main controller 100 (determining section 106) obtains a threshold of the number of activation times from a table of thresholds of the number of activation times illustrated in FIG. 10 (S303). The threshold of the number of activation times may be made the same value for all of the functions. However, in the case where high frequently activated functions (for example, printing and copying) and low frequently activated functions (for example, scanning and faxing) are mixed up, the threshold of the number of activation times may be changed for each function or each group of functions.

Next, the main controller 100 (determining section 106) sets "1" to variable j (S304), and obtains the j-th count value (the number of activation times) in the sorted function-use history table (S305).

Next, the main controller 100 (determining section 106) compares the count value obtained at S305 with the threshold obtained at S303 (S306). If the j-th count value is less than the threshold, a series of the processes is ended because the function is not a function expected to be used so frequently. On the other hand, if the j-th count value is equal to or larger than the threshold, the main controller 100 (determining section 106) calculates the total data size from the data size of data used by the j-th function of the function-use history table (by adding the j-th data size to the current total data size) because the function concerned is a function expected to be used frequently (S307).

Next, the main controller 100 (determining section 106) obtains a region size set beforehand for the function from the flash memory region table illustrated in FIG. 11 (S308). The region size may be made the same value for all of the functions. However, in the case where the function using data of which the data size tends to become large (for example, color printing, copying, and scanning) and the function using data of which the data size tends to become small (for example, monochrome printing, copying, and scanning) are mixed up, the region size may be changed for each function or each group of functions. Then, the main controller 100 (determining section 106) compares the total data size calculated at S307 with the region size obtained at S308 (S309).

If the calculated total data size is larger than the region size, a series of the processes is ended because switching the data recording mode for the calculated size of data can result in that the data presses the recording area of the flash memory 104 and it can cause a trouble in recording data used by another function. That is, under the condition that many functions are high frequently activated, and that it is considered that recording all data used by these functions in the SLC region may arise a shortage of a region for recording data used by other functions and may make the image forming apparatus difficult to provide its features, the main controller 100 does not change the region storing a piece of data concerned to the SLC region, and leaves the region the MLC region. On the other hand, if the calculated total data size is equal to or less than the region size, the main controller 100 (recording area changing section 107) changes the region storing a piece of data used by the j-th function in the function-use history table the a SLC region (S310). At that time, in the case where the SLC region stores a piece or pieces of data previously recorded, the recording area changing section 107 temporarily moves the data to the MLC region or to a certain memory device, and returns the moved data to the SLC region after changing the recording mode of the region (that is, after changing the size ratio of the regions), where the certain memory device is other than the flash memory 104 and is incorporated in or externally mounted on the image forming apparatus.

Successively, the main controller 100 (determining section 106) updates the value of the field of total data size in the function-use history table (S311), and increases the value of variable j by 1 (S312). Subsequently, the main controller 100 returns to S305, and executes repeatedly the processes at S306 to S311 on all the functions in the function-use history table.

By executing the above processes repeatedly, only the region or regions storing a piece or pieces of data used by the relatively high frequently activated function or functions are changed to the SLC region or regions, the reliability and accessing speed of data used by the relatively high frequently used function can be enhanced without pressing the recording area of the flash memory 104.

In the above flow, in the case where the total data size is equal to or less than the region size, the region recording the data used by the function is changed into the SLC region. However, even in the case where the total data size is equal to or less than the region size, the region the data may not be changed to the SLC region if occasion demands. For example, in the case where a certain function, such as copying, printing, and faxing, is activated to output multiple sets of prints, the image forming apparatus executes output processing for one print set while preparing output processing for the next print set. That is, it is necessary for the image forming apparatus to hold frame data of pages corresponding to two sets of prints. Under the situation that the flash memory 104 stores the frame data, it is assumed that the number of pages capable of being recorded in a certain region in the region size defined for the function is at most 9999 pages. In this case, if the number of pages to be output is at most 300 pages, it becomes possible to improve the processing speed of the function by changing the region or regions recording the frame data corresponding to 300 pages to the SLC region or regions. However, in the case where the number of pages to be output becomes at most 6000 pages, even if the total data size of the frame data is equal to or less than the region size, changing the region recording the frame data to the SLC region results in that the frame data more than that corresponding to at most 5000 pages cannot be stored in the region. Thereby, the function to output multiple sets of prints cannot be used. In such a case, the region recording the data may be controlled not to be changed to the SLC region. Alternatively, a region size corresponding to this function may be additionally set in the flash memory region table (that is, the region size for a printing function creating multiple sets of prints is established separately from the region size for an ordinary printing function).

Example 3

Figure 12:
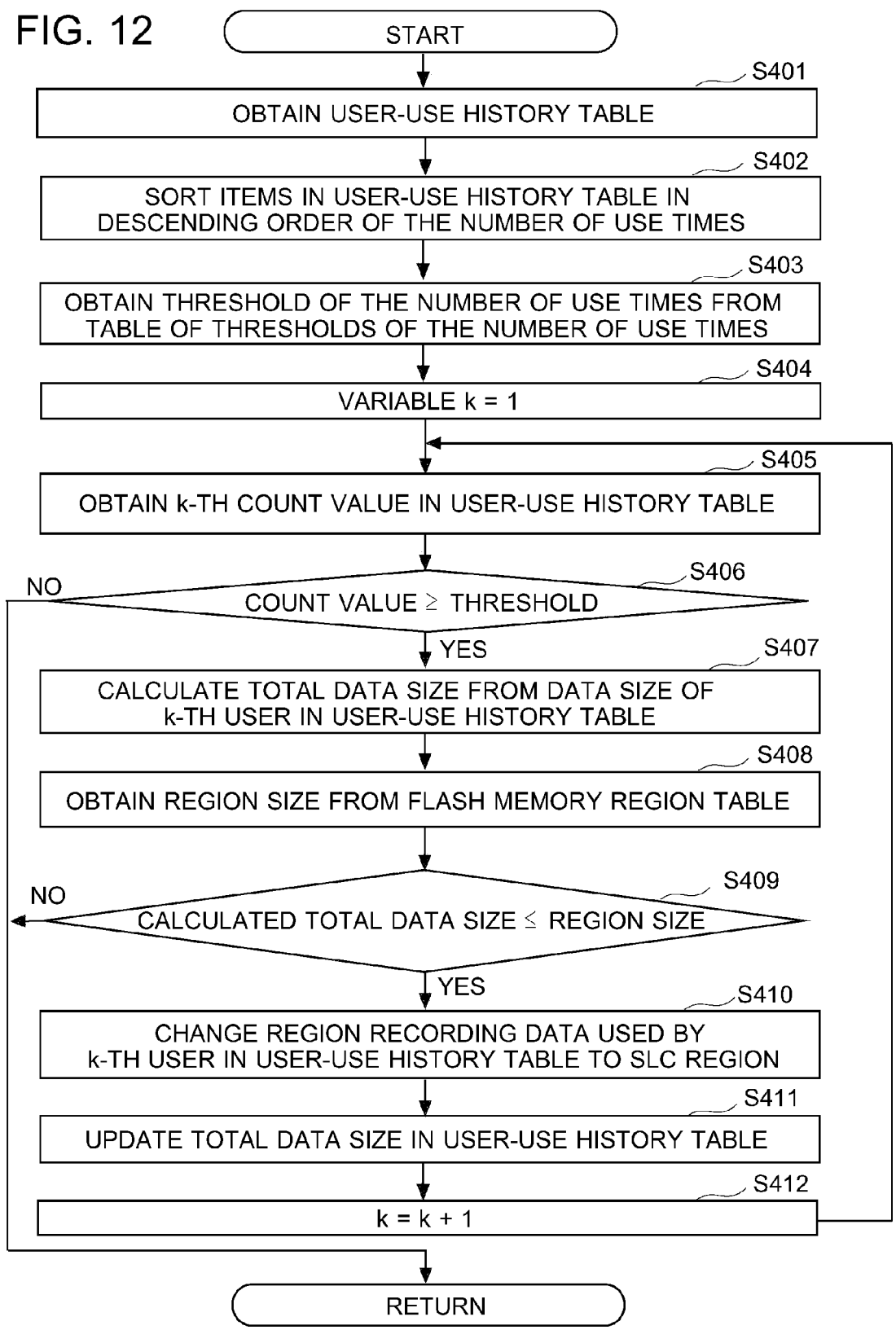
FIG. 12 is a flowchart illustrating operation (a process of changing a recording area of a flash memory on the basis of a use frequency about a user) of the image forming apparatus in relation to Example 3

Next, description is given to an image forming apparatus, a control method for a flash memory, and a control program in relation to Example 3 with reference to FIG. 12 to FIG. 15. FIG. 12 is a flowchart illustrating operation of the image forming apparatus of the present example, and FIG. 13 to FIG. 15 illustrate an example of a user-use history table, a table of thresholds of the number of use times, and a flash memory region table, respectively.

In the above-mentioned Example 2, description is given to a control to determine a relatively high frequently activated function and change the recording area of the flash memory 104 such that data used for the determined function can be recorded in the SLC region. The image forming apparatus is usually used by two or more users. The frequency of use of the image forming apparatus differs depending on users, and a processing performance requested for the image forming apparatus differs depending on users. For example, for a user who seldom uses the image forming apparatus, even if the operation speed of functions, such as scanning, copying, printing, and faxing, is somewhat slow, an influence on work is not so large. However, for a user who uses the image forming apparatus frequently, if the operation speed of functions is slow, work becomes late, which causes trouble in business. In view of that, the present example provides a control to determine a user or users who relatively high frequently use the apparatus, and change the recording area (the size ratio of recording regions) so as to allow the flash memory 104 to record a piece or pieces of data used by the determined user in a SLC region. In that case, although the basic constitution of each of the image forming apparatus and the control section is the same as that in FIG. 1 and FIG. 2 respectively in Example 1, operation of the control section is different from that in Example 1.

In concrete terms, the history information creating section 105 monitors user's operations performed on in the operation and display section 140, determines a user using the image forming apparatus on the basis of login information, and obtains the data size of a piece or pieces of data used by the user and the number of use times of the user. Further, the history information creating section 105 creates and stores the use history information for each user.

Further, the determining section 106 determines a use frequency of the apparatus by each user while referring to the use history information of each user, and determines a piece or pieces of data used by the user. For example, in the case where a certain user uses the apparatus high frequently, the determining section 106 determines a piece or pieces of data handled at the time of activating the function (print data used by a printing function, scan data used by a scanning function, and facsimile data used by a facsimile function) instructed by the user, as relatively high frequently used data.

Hereafter, description is given to the above control with reference to the flowchart illustrated in FIG. 12 and a table shown in each of FIG. 13 to FIG. 15. A control program is stored in a storage device such as the ROM 102 and the flash memory 104, and, when being executed by the CPU 103, causes the image forming apparatus to perform processes of steps illustrated in a flowchart of FIG. 12. Since the basic operation of the image forming apparatus is the same as that in FIG. 3 in Example 1, description is omitted.

First, the main controller 100 (determining section 106) obtains the use history information (user-use history table) stored beforehand in the RAM 101 (S401). FIG. 13 illustrates an example of a user information table, users (here, Users 1 to 10) registered in the image forming apparatus are recorded beforehand in the column of kind of user, the data size of data used by each user is recorded in the column of data size, and the number of times that a user has used the image forming apparatus during an arbitrary period is recorded in the column of the number of use times. The data size can be the size of data used when the user has used the image forming apparatus at the last time, or may be the average value, the maximum value, or the minimum value of the data of multiple times of use. The number of use times can be the number of use times during the whole period (the period from the time when the apparatus was installed or the apparatus was reset, to the present time), or the number of use times during a prescribed period (for example, the latest one month or one year). In the case of using the number of use times during a prescribed period, the values in the column of the number of use times may be reset after the prescribed period has elapsed.

Next, the main controller 100 (determining section 106) sorts items in the user-use history table in the descending order of the number of use times (S402). In the case of FIG. 13, sorting the items in the descending order of the number of use times results in that User 2, User 1 . . . and User 4 are arrayed in this order.

Next, the main controller 100 (determining section 106) obtains the threshold of the number of use times from a table of thresholds of the number of use times illustrated in FIG. 14 (S403). The threshold for the number of use times may be made the same value for all of the users. However, in the case where users who use the image forming apparatus frequently and users who seldom use the image forming apparatus are mixed up, the threshold of the number of use times may be changed for each user or each group of users.

Next, the main controller 100 (determining section 106) sets "1" to variable k (S404), and obtains the k-th count value (the number of use times) in the sorted user-use history table (S405).

Next, the main controller 100 (determining section 106) compares the count value obtained at S405 with the threshold obtained at S403 (S406). If the k-th count value is less than the threshold, a series of the processes is ended because the user is not a user who uses the image forming apparatus so frequently. On the other hand, if the k-th count value is equal to or more than the threshold, the main controller 100 (determining section 106) calculates the total data size from the data size of data used by the k-th user in the user-use history table (by adding the k-th data size to the current total data size) because the user is a user who uses the image forming apparatus so frequently (S407).

Next, the main controller 100 (determining section 106) obtains a region size set beforehand for the user from the flash memory region table illustrated in FIG. 15 (S408). The region size may be made the same value for all of the users. However, in the case where users who use large-sized data and users who use small-sized data are mixed up, the region size may be changed for each user or each group of users. Then, the main controller 100 (determining section 106) compares the total data size calculated at S407 with the region size obtained at S408 (S409).

If the calculated total data size is larger than the region size, a series of the processes is ended because switching the data recording mode for the calculated size of data can result in that the data presses the recording area of the flash memory 104 and it can cause a trouble in recording data used by another user. That is, under the condition that many users high frequently uses the apparatus, and that it is considered that recording all data used by these users in the SLC region may arise a shortage of a region for recording data used by other users and may make the image forming apparatus difficult to provide its features, the main controller 100 does not change the region storing a piece of data concerned to the SLC region, and leaves the region the MLC region. On the other hand, if the calculated total data size is equal to or less than the region size, the main controller 100 (recording area changing section 107) changes the region storing a piece of data used by the k-th user in the user-use history table to a SLC region (S410).

At that time, in the case where the SLC region stores a piece or pieces of data previously recorded, the recording area changing section 107 temporarily moves the data to the MLC region or to a certain memory device, and returns the moved data to the SLC region after changing the recording mode of the region (that is, after changing the size ratio of the regions), where the certain memory device is other than the flash memory 104 and is incorporated in or externally mounted on the image forming apparatus.

Successively, the main controller 100 (determining section 106) updates the value of the field of total data size in the user-use history table (S411), and increases the value of variable k by 1 (S412). Subsequently, the main controller 100 returns to S405, and executes repeatedly the processes at S406 to S411 to all the users of the user-use history table.

By executing the above processes repeatedly, only the region or regions storing a piece or pieces of data used by the user or users using the apparatus relatively high frequently are changed to the SLC region or regions, the reliability and accessing speed of data used by a user or users using the apparatus relatively high frequently can be enhanced without pressing the recording area of the flash memory 104.

Incidentally, the present invention should not be limited to the above-mentioned embodiments and examples and unless deviating from the intention of the present invention, the constitution of the image forming apparatus and its control method may be changed appropriately.

For example, in Example 1, the recording area of the flash memory 104 is changed based on the use history information about data; in Example 2, the recording area of the flash memory 104 is changed based on the use history information about functions; and in Example 3, the recording area of the flash memory 104 is changed based on the use history information about users. Alternatively, the recording area of the flash memory 104 may be also changed based on arbitral combination of the use history information about data, functions, and users by combining the above examples arbitrarily. For example, the recording area may be changed such that among pieces of data used by a relatively high frequently used function, relatively high frequently used data can be recorded in the SLC region. Alternatively, the recording area may be changed such that among pieces of data used by a relatively high frequently used function, pieces of data used by a user who uses the function relatively high frequently can be recorded in the SLC region. Alternatively, the recording area may be changed such that among data used by a user relatively high frequently uses the apparatus, pieces of data used by a function which the user used relatively high frequently can be recorded in the SLC region.

Further, in each of the above examples, the image forming apparatus is exemplified as the information processing apparatus. The information processing apparatus should not be limited to the image forming apparatus. The control method of the present invention can be similarly applied to an arbitral apparatus which is equipped with the flash memory 104 and activates functions by using data stored in the flash memory 104.

The invention claimed is:

1. An image forming apparatus comprising:
   a flash memory including a recording area configured such that a data recording mode of the recording area is regionally switchable between a multilevel recording mode in which each memory cell stores more than one bit of data and a binary recording mode in which each memory cell stores one bit of data;
   a history information creating section which monitors a usage state of the image forming apparatus to create and store use history information;
   a determining section which determines a piece or pieces of data which are higher in use frequency than other pieces of data, among data pieces recorded in the flash memory, while referring to the use history information; and
   a recording area changing section which changes a size ratio of a region or regions where data is stored in the binary recording mode and a region or regions where data is stored in the multilevel recording mode in the recording area of the flash memory so that the flash memory is configured to record the at least the piece or pieces of data determined by the determining section, in the binary recording mode.

2. The image forming apparatus of claim 1,
   wherein the history information creating section
      monitors access to the data pieces recorded in the flash memory, and
      obtains a data size and the number of access times of each of the data pieces to create the use history information, and
   the determining section
      compares the number of access times of each of the data pieces with a first predetermined threshold while referring to the use history information, and
      determines a piece or pieces of data the number of access times of which is equal to or larger than the first predetermined threshold, as the piece or pieces of data which are higher in use frequency.

3. The image forming apparatus of claim 1, further comprising an operation section which allows a user to give an instruction to activate any of functions of the image forming apparatus,
   wherein the history information creating section
      monitors user's operations performed on the operation section, and
      obtains a data size of a piece or pieces of data used by each of the functions activated by user's instructions through the operation section and the number of activation times of each of the functions activated by user's instructions through the operation section, to create the use history information, and
   the determining section
      compares the number of activation times of each of the functions with a second predetermined threshold while referring to the use history information, and
      determines a piece or pieces of data used by the function or functions the number of activation times of which is equal to or larger than the second predetermined threshold, as the piece or pieces of data which are higher in use frequency.

4. The image forming apparatus of claim 1, further comprising an operation section which allows a user to perform a login operation,
   wherein the history information creating section
      monitors a user's operation performed on the operation section, and
      obtains data size of a piece or pieces of data used by each of users who performed a login operation through the operation section and the number of times of use of the image forming apparatus by each of the users, to create the use history information, and
   the determining section
      compares the number of times of use of the image forming apparatus by each of the users with a third predetermined threshold while referring to the use history information, and
      determines a piece or pieces of data used by the user or users the number of times of the use by which is equal to or larger than the third predetermined threshold, as the piece or pieces of data which are higher in use frequency.

5. The image forming apparatus of claim 1, wherein the data pieces recorded in the flash memory include any of scan data, copy data, print data, facsimile data, and counter information.

6. The image forming apparatus of claim 1,
   wherein the determining section determines the piece or pieces of data successively until the total data size of piece or pieces of data which have been determined exceeds a predetermined region size.

7. The image forming apparatus of claim 1,
   wherein the recording area changing section
      moves a piece or pieces of data recorded beforehand in the region or regions which record data in the binary recording mode, to the region or regions which record data in the multi-level recording mode or to a memory device other than the flash memory, temporarily before the changing the size ratio, and returns the piece or pieces of data temporarily moved, to the region or regions which record data in the binary recording mode, after the changing the size ratio.

8. The image forming apparatus of claim 1,
wherein the recording area changing section changes the size ratio on a starting up of the image forming apparatus, on a shutdown of the image forming apparatus, or at a time when the image forming apparatus is in nonuse.

9. A control method for a flash memory in an image forming apparatus, the flash memory including a recording area configured such that a data recording mode of the recording area is regionally switchable between a multilevel recording mode in which each memory cell stores more than one bit of data and a binary recording mode in which each memory cell stores one bit of data, the method comprising:
monitoring a usage state of the image forming apparatus to create and store use history information;
determining a piece or pieces of data which are higher in use frequency than other pieces of data, among data pieces recorded in the flash memory, while referring to the use history information; and
changing a size ratio of a region or regions where data is stored in the binary recording mode and a region or regions where data is stored in the multilevel recording mode in the recording area of the flash memory so that the flash memory is configured to record the at least the determined piece or pieces of data, in the binary recording mode.

10. The control method of claim 9,
wherein the monitoring the usage state of the image forming apparatus to create and store the use history information, includes
monitoring access to the data pieces recorded in the flash memory, and
obtaining a data size and the number of access times of each of the data pieces to create the use history information, and
the determining the piece or pieces of data includes
comparing the number of access times of each of the data pieces with a first predetermined threshold while referring to the use history information, and
determining a piece or pieces of data the number of access times of which is equal to or larger than the first predetermined threshold, as the piece or pieces of data which are higher in use frequency.

11. The control method of claim 9,
wherein the image forming apparatus includes an operation section which allows a user to give an instruction to activate any of functions of the image forming apparatus, and
wherein the monitoring the usage state of the image forming apparatus to create and store the use history information, includes
monitoring user's operations performed on the operation section, and
obtaining a data size of a piece or pieces of data used by each of the functions activated by user's instructions through the operation section and the number of activation times of each of the functions activated by user's instructions through the operation section, to create the use history information, and
the determining the piece or pieces of data includes
comparing the number of activation times of each of the functions with a second predetermined threshold while referring to the use history information, and
determining a piece or pieces of data used by the function or functions the number of activation times of which is equal to or larger than the second predetermined threshold, as the piece or pieces of data which are higher in use frequency.

12. The control method of claim 9,
wherein the image forming apparatus includes an operation section which allows a user to perform a login operation, and
wherein the monitoring the usage state of the image forming apparatus to create and store the use history information, includes
monitoring a user's operation performed on the operation section, and
obtaining data size of a piece or pieces of data used by each of users who performed a login operation through the operation section and the number of times of use of the image forming apparatus by each of the users, to create the use history information, and
the determining the piece or pieces of data includes
comparing the number of times of use of the image forming apparatus by each of the users with a third predetermined threshold while referring to the use history information, and
determining a piece or pieces of data used by the user or users the number of times of the use by which is equal to or larger than the third predetermined threshold, as the piece or pieces of data which are higher in use frequency.

13. The control method of claim 9,
wherein the data pieces recorded in the flash memory include any of scan data, copy data, print data, facsimile data, and counter information.

14. The control method of claim 9,
wherein the determining the piece or pieces of data includes determining the piece or pieces of data successively until the total data size of piece or pieces of data which have been determined exceeds a predetermined region size.

15. The control method of claim 9,
wherein the changing the size ratio includes
moving a piece or pieces of data recorded beforehand in the region or regions which record data in the binary recording mode, to the region or regions which record data in the multi-level recording mode or to a memory device other than the flash memory, temporarily before the changing the size ratio, and
returning the piece or pieces of data temporarily moved, to the region or regions which record data in the binary recording mode, after the changing the size ratio.

16. The control method of claim 9,
wherein the changing the size ratio is performed on a starting up of the image forming apparatus, on a shutdown of the image forming apparatus, or at a time when the image forming apparatus is in nonuse.

17. A non-transitory computer-readable storage medium storing a control program to be executed in an image forming apparatus which includes a flash memory including a recording area configured such that a data recording mode of the recording area is regionally switchable between a multilevel recording mode in which each memory cell stores more than one bit of data and a binary recording mode in which each memory cell stores one bit of data, the control program, when being executed by a processor of the image forming apparatus, causing the image forming apparatus to perform processing comprising:
monitoring a usage state of the image forming apparatus to create and store use history information;
determining a piece or pieces of data which are higher in use frequency than other pieces of data, among data pieces recorded in the flash memory, while referring to the use history information; and
changing a size ratio of a region or regions where data is stored in the binary recording mode and a region or regions where data is stored in the multilevel recording mode in the recording area of the flash memory so that the flash memory is configured to record the at least the determined piece or pieces of data, in the binary recording mode.

18. The non-transitory computer-readable storage medium of claim 17,
wherein the monitoring the usage state of the image forming apparatus to create and store the use history information, includes
monitoring access to the data pieces recorded in the flash memory, and
obtaining a data size and the number of access times of each of the data pieces to create the use history information, and
the determining the piece or pieces of data includes
comparing the number of access times of each of the data pieces with a first predetermined threshold while referring to the use history information, and
determining a piece or pieces of data the number of access times of which is equal to or larger than the first predetermined threshold, as the piece or pieces of data which are higher in use frequency.

19. The non-transitory computer-readable storage medium of claim 17,
wherein the image forming apparatus includes an operation section which allows a user to give an instruction to activate any of functions of the image forming apparatus, and
wherein the monitoring the usage state of the image forming apparatus to create and store the use history information, includes
monitoring user's operations performed on the operation section, and
obtaining a data size of a piece or pieces of data used by each of the functions activated by user's instructions through the operation section and the number of activation times of each of the functions activated by user's instructions through the operation section, to create the use history information, and
the determining the piece or pieces of data includes
comparing the number of activation times of each of the functions with a second predetermined threshold while referring to the use history information, and
determining a piece or pieces of data used by the function or functions the number of activation times of which is equal to or larger than the second predetermined threshold, as the piece or pieces of data which are higher in use frequency.

20. The non-transitory computer-readable storage medium of claim 17,
wherein the image forming apparatus includes an operation section which allows a user to perform a login operation, and wherein the monitoring the usage state of the image forming apparatus to create and store the use history information, includes
monitoring a user's operation performed on the operation section, and
obtaining data size of a piece or pieces of data used by each of users who performed a login operation through the operation section and the number of times of use of the image forming apparatus by each of the users, to create the use history information, and
the determining the piece or pieces of data includes
comparing the number of times of use of the image forming apparatus by each of the users with a third predetermined threshold while referring to the use history information, and
determining a piece or pieces of data used by the user or users the number of times of the use by which is equal to or larger than the third predetermined threshold, as the piece or pieces of data which are higher in use frequency.

21. The non-transitory computer-readable storage medium of claim 17,
wherein the data pieces recorded in the flash memory include any of scan data, copy data, print data, facsimile data, and counter information.

22. The non-transitory computer-readable storage medium of claim 17,
wherein the determining the piece or pieces of data includes determining the piece or pieces of data successively until the total data size of piece or pieces of data which have been determined exceeds a predetermined region size.

23. The non-transitory computer-readable storage medium of claim 17, wherein the changing the size ratio includes
moving a piece or pieces of data recorded beforehand in the region or regions which record data in the binary recording mode, to the region or regions which record data in the multi-level recording mode or to a memory device other than the flash memory, temporarily before the changing the size ratio, and
returning the piece or pieces of data temporarily moved, to the region or regions which record data in the binary recording mode, after the changing the size ratio.

24. The non-transitory computer-readable storage medium of claim 17,
wherein the changing the size ratio is performed on a starting up of the image forming apparatus, on a shutdown of the image forming apparatus, or at a time when the image forming apparatus is in nonuse.

25. An information processing apparatus comprising:
a flash memory including a recording area configured such that a data recording mode of the recording area is regionally switchable between a multilevel recording mode in which each memory cell stores more than one bit of data and a binary recording mode in which each memory cell stores one bit of data;
a history information creating section which monitors a usage state of the information processing apparatus to create and store use history information;
a determining section which determines a piece or pieces of data which are higher in use frequency than other pieces of data, among data pieces recorded in the flash memory, while referring to the use history information; and a recording area changing section which changes a size ratio of a region or regions where data is stored in the binary recording mode and a region or regions where data is stored in the multilevel recording mode in the recording area of the flash memory so that the flash memory is configured to record the at least the piece or pieces of data determined by the determining section, in the binary recording mode.

26. A non-transitory computer-readable storage medium storing a control program to be executed in an information processing apparatus which includes a flash memory including a recording area configured such that a data recording mode of the recording area is regionally switchable between a multilevel recording mode in which each memory cell stores more than one bit of data and a binary recording mode in which each memory cell stores one bit of data, the control program, when being executed by a processor of the information processing apparatus, causing the information processing apparatus to perform processing comprising:

monitoring a usage state of the information processing apparatus to create and store use history information;

determining a piece or pieces of data which are higher in use frequency than other pieces of data, among data pieces recorded in the flash memory, while referring to the use history information; and changing a size ratio of a region or regions where data is stored in the binary recording mode and a region or regions where data is stored in the multilevel recording mode in the recording area of the flash memory so that the flash memory is configured to record the at least the determined piece or pieces of data, in the binary recording mode.

\* \* \* \* \*